(12) United States Patent
Behfar et al.

(10) Patent No.: US 9,692,202 B2
(45) Date of Patent: Jun. 27, 2017

(54) LASERS WITH BEAM SHAPE AND BEAM DIRECTION MODIFICATION

(71) Applicant: MACOM TECHNOLOGY SOLUTIONS HOLDINGS, INC., Lowell, MA (US)

(72) Inventors: Alex A. Behfar, Keswick, VA (US); Cristian Stagarescu, Ithaca, NY (US); Norman Sze-keung Kwong, San Marino, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 14/535,590

(22) Filed: Nov. 7, 2014

(65) Prior Publication Data

US 2015/0124846 A1 May 7, 2015

Related U.S. Application Data

(60) Provisional application No. 61/901,265, filed on Nov. 7, 2013.

(51) Int. Cl.
*H01S 5/18* (2006.01)
*H01S 5/00* (2006.01)
*H01S 5/022* (2006.01)
*H01S 5/026* (2006.01)

(52) U.S. Cl.
CPC ........ *H01S 5/0071* (2013.01); *H01S 5/02252* (2013.01); *H01S 5/026* (2013.01); *H01S 5/18* (2013.01); *H01S 2301/185* (2013.01)

(58) Field of Classification Search
CPC ........... H01S 5/18; H01S 5/026; H01S 5/0071
See application file for complete search history.

(56) References Cited

U.S. PATENT DOCUMENTS

| 3,290,539 | A | * | 12/1966 | Lamorte | 313/114 |
|---|---|---|---|---|---|
| 4,718,070 | A | * | 1/1988 | Liau et al. | 372/50.12 |
| 4,784,722 | A | * | 11/1988 | Liau et al. | 438/34 |
| 4,851,368 | A | | 7/1989 | Behfar-Rad et al. | |
| 4,901,329 | A | * | 2/1990 | Leas | 372/50.21 |

(Continued)

FOREIGN PATENT DOCUMENTS

| DE | 3138704 A1 | * | 4/1983 | H01S 3/19 |
|---|---|---|---|---|
| DE | 102004049683 | * | 4/2006 | H01S 5/065 |

(Continued)

OTHER PUBLICATIONS

Behfar-Rad, et al., "Monolithic AlGaAs—GaAs Quantum-Well Ridge Lasers Fabricated with Dry-Etched Facets and Ridges", IEEE Journal of Quantum Electronics, 28(5):1227-1231, May 1992, 5 pages.

(Continued)

*Primary Examiner* — Joshua King
(74) *Attorney, Agent, or Firm* — Wilmer Cutler Pickering Hale and Dorr LLP

(57) ABSTRACT

A reflective surface is disclosed in conjunction with a semiconductor laser to shape a laser beam and modify a direction of the laser beam. The reflective surface may be formed on a structure disposed adjacent to a laser structure to allow high coupling of laser light to, for example, a silicon photonics chip or an optical fiber.

25 Claims, 14 Drawing Sheets

(56) References Cited

U.S. PATENT DOCUMENTS

| | | | |
|---|---|---|---|
| 4,935,939 A * | 6/1990 | Liau et al. | 372/98 |
| 4,990,465 A * | 2/1991 | Liau et al. | 438/29 |
| 5,025,451 A * | 6/1991 | Jansen et al. | 372/50.121 |
| 5,070,511 A * | 12/1991 | Kappeler et al. | 372/50.23 |
| 5,335,243 A * | 8/1994 | Kubena et al. | 372/99 |
| 5,492,607 A * | 2/1996 | Yap | 204/192.34 |
| 5,563,901 A * | 10/1996 | Otoma et al. | 372/50.12 |
| 5,625,483 A * | 4/1997 | Swartz | 359/224.1 |
| 5,729,568 A * | 3/1998 | Opower et al. | 372/108 |
| 5,995,289 A * | 11/1999 | Hwu et al. | 359/627 |
| 6,259,713 B1 * | 7/2001 | Hwu et al. | 372/36 |
| 6,347,103 B1 * | 2/2002 | Song et al. | 372/36 |
| 6,975,465 B1 * | 12/2005 | Chung et al. | 359/831 |
| 7,483,467 B2 * | 1/2009 | Kohara et al. | 372/50.12 |
| 7,606,277 B2 | 10/2009 | Behfar et al. | |
| 7,799,587 B2 | 9/2010 | Behfar et al. | |
| 7,835,415 B2 | 11/2010 | Behfar et al. | |
| 8,130,806 B2 | 3/2012 | Behfar et al. | |
| 8,787,418 B2 | 7/2014 | Shur et al. | |
| 2002/0159491 A1 * | 10/2002 | Jiang et al. | 372/45 |
| 2005/0157770 A1 * | 7/2005 | Behfar et al. | 372/50 |
| 2005/0163181 A1 * | 7/2005 | Takayama | 372/46 |
| 2006/0118893 A1 * | 6/2006 | Behfar et al. | 257/414 |
| 2010/0246624 A1 * | 9/2010 | Hiroyama et al. | 372/45.01 |
| 2010/0265981 A1 * | 10/2010 | Hiroyama et al. | 372/49.01 |
| 2013/0301666 A1 | 11/2013 | Stagarescu et al. | |

FOREIGN PATENT DOCUMENTS

| | | | | |
|---|---|---|---|---|
| EP | 0423513 A2 * | 9/1990 | | H01S 3/085 |
| FR | 2897726 A1 * | 8/2007 | | H01S 5/18 |
| WO | WO-02089276 A1 | 11/2002 | | |

OTHER PUBLICATIONS

International Search Report and Written Opinion issued in PCT/US14/64575, dated Aug. 5, 2015, 11 pages.

Itaya, et al., "Spot-Size Converter Integrated Laser Diodes (SS-LD's)", IEEE Journal of Selected Topics in Quantum Electronics, 3(3):968-974, Jun. 1997, 7 Pages.

Moerman, et al., "A Review on Fabrication Technologies for the Monolithic Integration of Tapers with III-V Semiconductor Devices", IEEE Journal of Selected Topics in Quantum Electronics, 3(6):1308-1320, Dec. 1997, 13 Pages.

Vermeulen, et al., "High-Efficiency Fiber-to-Chip Grating Couplers Realized Using an Advanced CMOS-Compatible Silicon-On-Insulator Platform", Optics Express, 18(17):18278-18283, Aug. 16, 2010, 6 Pages.

Waits, et al., "Microfabrication of 3D Silicon MEMS Structures Using Gray-Scale Lithography and Deep Reactive Ion Etching", Sensors and Actuators A, 119, pp. 245-253, 2005, 9 pages.

Yamazaki, et al., "1.3-µm Spot-Size-Converter Integrated Laser Diodes Fabricated by Narrow-Stripe Selective MOVPE", IEEE Journal of Selected Topics in Quantum Electronics, 3(6):1392-1398, Dec. 1997, 7 Pages.

Extended European Search Report issued in EP14883155.5; dated Apr. 20, 2017 (8 pages).

* cited by examiner

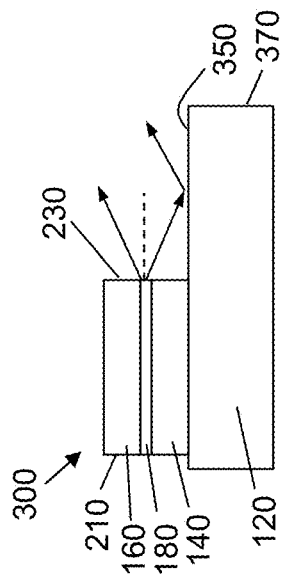
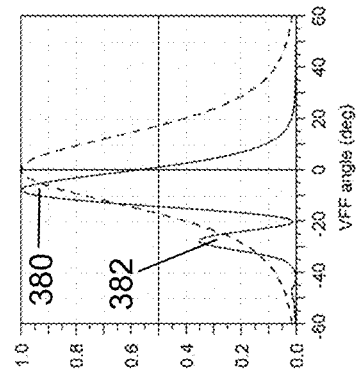
Figure 1 (a)
Figure 1 (b)
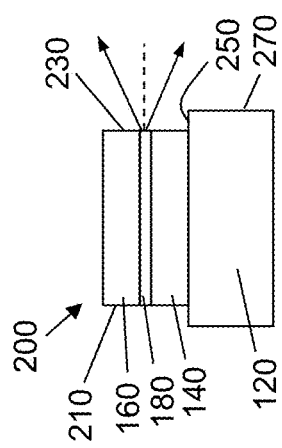
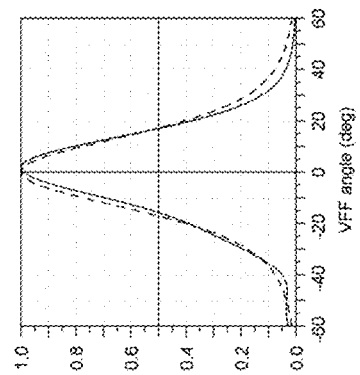
Figure 2 (a)
Figure 2 (b)
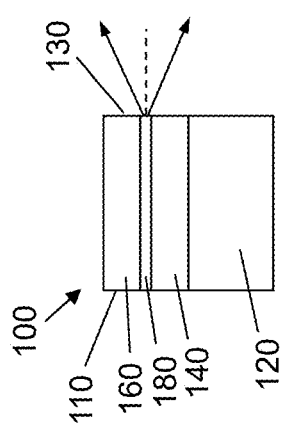
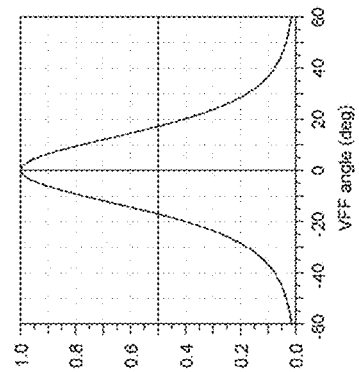
Figure 3 (a)
Figure 3 (b)

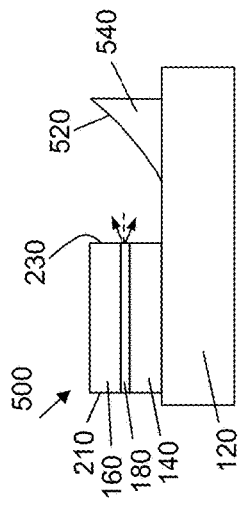
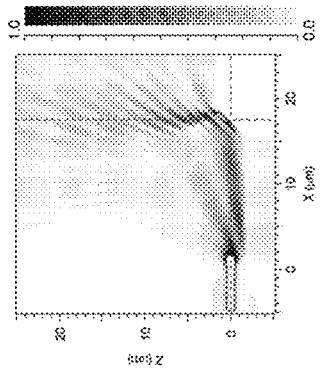
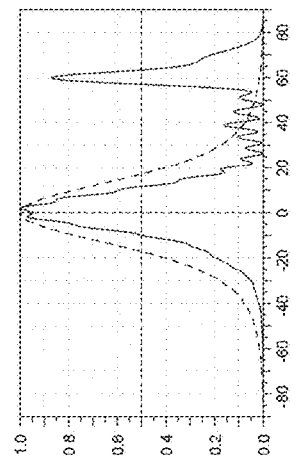
Figure 4 (a)
Figure 4 (b)
Figure 4 (c)
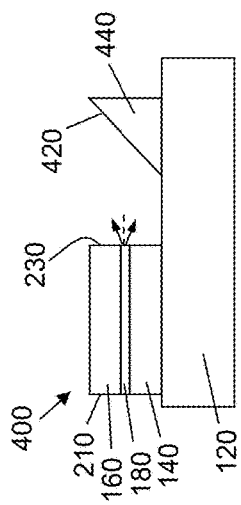
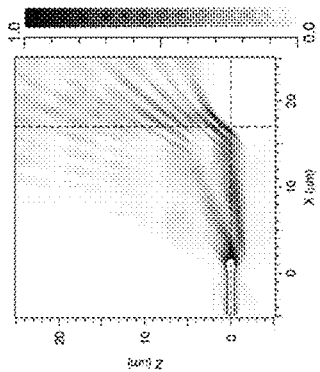
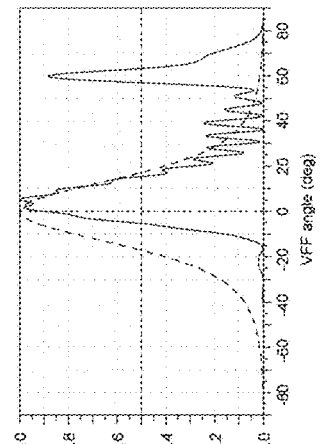
Figure 5 (a)
Figure 5 (b)
Figure 5 (c)

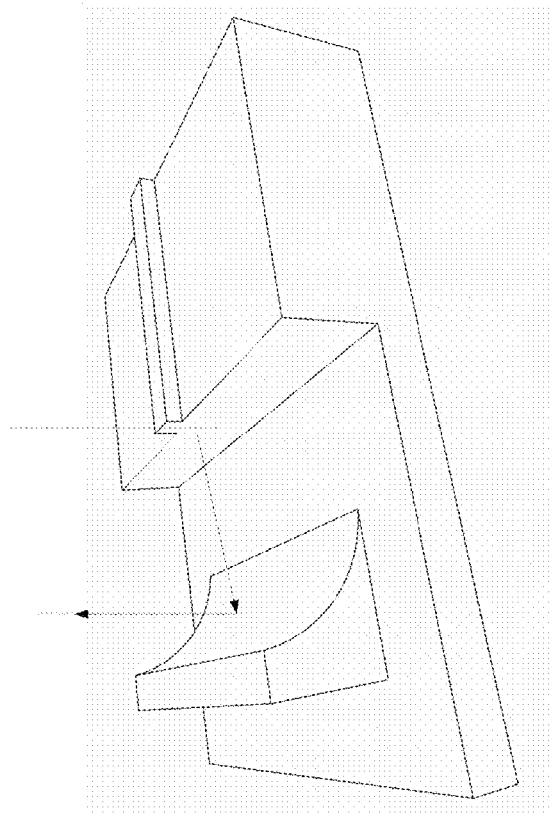
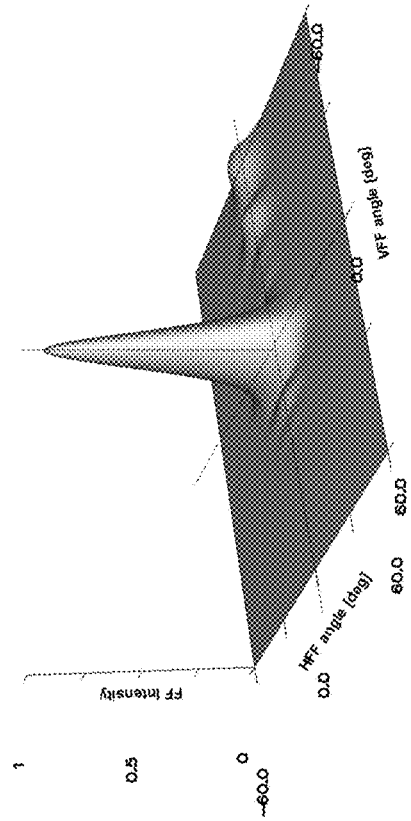
Figure 12 (a)
Figure 12 (b)

LASERS WITH BEAM SHAPE AND BEAM DIRECTION MODIFICATION

CROSS-REFERENCE TO RELATED APPLICATIONS

This patent application claims priority to U.S. Provisional Patent Application No. 61/901,265, filed Nov. 7, 2013, which is hereby incorporated by reference herein in its entirety.

FIELD OF THE DISCLOSURE

The present disclosure relates, in general, to photonic devices, and, more particularly, to improved photonic devices and methods for fabricating them.

BACKGROUND OF THE DISCLOSURE

Semiconductor lasers are typically fabricated on a wafer by growing an appropriate layered semiconductor material on a substrate through Metalorganic Chemical Vapor Deposition (MOCVD) or Molecular Beam Epitaxy (MBE) to form an epitaxial structure having an active region parallel to the substrate surface. The wafer is then processed with a variety of semiconductor processing tools to produce a laser optical cavity incorporating the active region and incorporating metallic contacts attached to the semiconductor material. Laser facets are typically formed at the ends of the laser cavity by cleaving the semiconductor material along its crystalline structure to define edges, or ends, of the laser optical cavity so that when a bias voltage is applied across the contacts, the resulting current flow through the active region causes photons to be emitted out of the faceted edges of the active region in a direction perpendicular to the current flow. Since the semiconductor material is cleaved to form the laser facets, the locations and orientations of the facets are limited; furthermore, once the wafer has been cleaved, typically it is in small pieces so that conventional lithographical techniques cannot readily be used to further process the lasers.

The foregoing and other difficulties resulting from the use of cleaved facets led to the development of a process for forming the facets of semiconductor lasers through etching. This process, as described in U.S. Pat. No. 4,851,368, also allows lasers to be monolithically integrated with other photonic devices on the same substrate, the disclosure of which is hereby incorporated herein by reference. This work was further extended and a ridge laser process based on etched facets was disclosed in the IEEE Journal of Quantum Electronics, volume 28, No. 5, pages 1227-1231, May 1992.

One of the major challenges in the use of semiconductor lasers is the mismatch between the output beam from the laser and the medium to which the beam is directed or coupled. For example, forming a semiconductor laser with spot size converters (SSC) can allow more efficient coupling of the laser light to an optical fiber or expand the tolerance for optical alignment, however, in general there are certain disadvantages that come along with forming SSC, such as process complexity and degradation in laser characteristics. An example of the degradation in laser characteristics is the increase in the laser threshold current. The following publications discuss the various SSC approaches employed: "Spot-Size Converter Integrated Laser Diodes (SS-LD's)" by Itaya, et al., IEEE Journal of Selected Topics in Quantum Electronics, Volume 3, Number 3, pages 968-974; "A Review on Fabrication Technologies for the Monolithic Integration of Tapers with III-V Semiconductor Devices" by Moerman, et al., IEEE Journal of Selected Topics in Quantum Electronics, Volume 3, Number 6, pages 1308-1320; and "1.3-µm Spot-Size-Converter Integrated Laser Diodes Fabricated by Narrow-Stripe Selective MOVPE" by Yamazaki, et al., IEEE Journal of Selected Topics in Quantum Electronics, Volume 3, Number 6, pages 1392-1398.

A laser structure formed through a process that allows beam modification without significant impact to laser characteristics, such as laser threshold, is very desirable, and, for example, can lead to very efficient coupling of the laser beam into an optical fiber with low cost packaging, reducing power consumption. Furthermore, the ability to direct the beam at an angle perpendicular to the substrate or off from perpendicular to the substrate is desirable in many applications, such as optical fibers and silicon photonics were efficient coupling of light to gratings on the silicon photonic chip are very important (see, for example, High-Efficiency Fiber-to-Chip Grating Couplers realized using "An Advanced CMOS-Compatible Silicon-On-Insulator Platform" by Vermeulen, et al., Optics Express, Volume 18 Issue 17, pages 18278-18283, 2010). Display applications such as pico-projectors or retinal projectors require laser light to be shaped and directed to elements such as Micro-Electro-Mechanical Systems or MEMS components with the least weight and size, and with the highest efficiency.

SUMMARY OF THE DISCLOSURE

A reflective surface is disclosed in conjunction with a semiconductor laser to shape a laser beam and modify a direction of the laser beam. The reflective surface may be formed on a structure disposed adjacent to a laser structure to allow high coupling of laser light to, for example, a silicon photonics chip or an optical fiber.

In one embodiment of the present disclosure, the direction of the laser beam from an etched facet laser is modified with a reflective surface in front of an output facet of the laser. In another embodiment of the present disclosure, a vertical far-field of the laser is modified by a shape of the reflective surface in front of the output facet. In yet another embodiment of the present disclosure, a horizontal far-field of the laser is modified by a shape of the reflective surface in front of the output facet. In yet another embodiment of the present disclosure, two or more of the aforementioned modifications occur simultaneously.

BRIEF DESCRIPTION OF THE DRAWINGS

The foregoing and additional objects, features and advantages of the present disclosure will become apparent to those of skill in the art from the following detailed description of the present disclosure taken with the accompanying drawings, which are briefly described as follows.

FIG. 1 (a) is a cross-section of a semiconductor laser with both front and back facets formed through cleaving; and FIG. 1 (b) is the corresponding vertical far-field (VFF) from either the front or back facets obtained through 2-dimensional RSoft Finite-Difference Time-Domain (FDTD) simulations.

FIG. 2 (a) is a cross-section of a semiconductor laser with both front and back facets formed through etching, with a flat patio of 2 µm adjacent the front facet; and FIG. 2 (b) contains the corresponding VFF to this structure in solid line obtained through 2-dimensional RSoft FDTD simulations and the VFF from FIG. 1 (b) in dashed line for reference.

FIG. 3 (a) is a cross-section of a semiconductor laser with both front and back facets formed through etching, with a flat patio of 10 μm adjacent the front facet; and FIG. 3 (b) contains the corresponding VFF for this structure in solid line obtained through 2-dimensional RSoft FDTD simulations and the VFF from FIG. 1 (b) in dashed line for reference.

FIG. 4 (a) is a cross-section of a semiconductor laser with both front and back facets formed through etching, with a flat patio of length 15 μm adjacent the front facet, the patio surface at 2 μm below the plane of the center of the active region, a flat reflective surface at 45.0° to the plane of the substrate adjacent to the patio, and reflective surface height 2 μm above the center of the active region; FIG. 4 (b) shows 2-dimensional RSoft FDTD simulations of the intensity of light for the light exiting the front facet and being modified by the reflective surface; and FIG. 4 (c) shows the VFF in a direction perpendicular to the substrate in a solid line, while the VFF from FIG. 1 (b) is shown in dashed line for reference.

FIG. 5 (a) is a cross-section of a semiconductor laser with both front and back facets formed through etching, with a flat patio of length 15 μm adjacent the front facet, the patio surface at 2 μm below the plane of the center of the active region, a curved reflective surface adjacent to the patio, and reflective surface height 2 μm above the center of the active region; FIG. 5 (b) shows 2-dimensional RSoft FDTD simulations of the intensity of light for the light exiting the front facet and being modified by the reflective surface; and FIG. 5 (c) shows the VFF in a direction perpendicular to the substrate in a solid line, while the VFF from FIG. 1 (b) is shown in dashed line for reference.

FIG. 6 (b) shows 2-dimensional RSoft FDTD simulations of the intensity of light for the light exiting the front facet and being modified by the reflective surface; and FIG. 6 (c) shows the VFF in a direction perpendicular to the substrate in a solid line, while the VFF from FIG. 1 (b) is shown in dashed line for reference.

FIG. 7 (b) shows 2-dimensional RSoft FDTD simulations of the intensity of light for the light exiting the front facet and being modified by the reflective surface; and FIG. 7 (c) shows the VFF in a direction perpendicular to the substrate in a solid line, while the VFF from FIG. 1 (b) is shown in dashed line for reference.

FIG. 8 (b) shows 2-dimensional RSoft FDTD simulations of the intensity of light for the light exiting the front facet and being modified by the reflective surface; and FIG. 8 (c) shows the VFF in a direction perpendicular to the substrate in a solid line, while the VFF from FIG. 1 (b) is shown in dashed line for reference.

FIG. 9 (b) shows 2-dimensional RSoft FDTD simulations of the intensity of light for the light exiting the front facet and being modified by the reflective surface; and FIG. 9 (c) shows the VFF in a direction perpendicular to the substrate in a solid line, while the VFF from FIG. 1 (b) is shown in dashed line for reference.

FIG. 11 (b) shows 2-dimensional RSoft FDTD simulations of the intensity of light for the light exiting the front facet and being modified by the reflective surface; and FIG. 11 (c) shows the VFF in a direction perpendicular to the substrate in a solid line, while the VFF from FIG. 1 (b) is shown in dashed line for reference.

FIG. 12 (a) shows a perspective view of an etched facet ridge laser with a curved reflective surface positioned adjacent to the front facet, used to modify the direction and shape of the beam, while the beam center is close to a perpendicular plane through the cavity along the ridge; FIG. 12 (b) shows the far-field in a cross-section parallel to the plane of the substrate and obtained through 3-dimensional RSoft FDTD simulations.

FIG. 13 (b) shows the far-field in a cross-section parallel to the plane of the substrate and obtained through 3-dimensional RSoft FDTD simulations.

FIG. 14 (b) shows the far-field in a cross-section parallel to the plane of the substrate and obtained through 3-dimensional RSoft FDTD simulations.

FIG. 15 (b) shows the far-field in a cross-section parallel to the plane of the substrate and obtained through 3-dimensional RSoft FDTD simulations.

FIG. 16 (*b*) and FIG. 16 (*c*) show the an etched facet ridge laser with a curved reflective surface positioned adjacent to the front facet, used to modify the direction and shape of the beam in both the VFF and HFF; FIG. 16 (*d*) shows the far-field in a cross-section parallel to the plane of the substrate and obtained through 3-dimensional RSoft FDTD simulations.

DETAILED DESCRIPTION OF EMBODIMENTS

Figure 7:
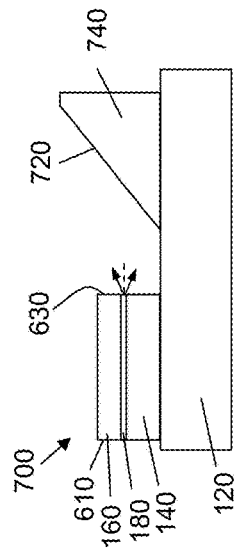
FIG. 7 (a) is a cross-section of a semiconductor laser with both front and back facets formed through etching, with a flat patio of length 5 μm adjacent the front facet, the patio surface at 3 μm below the plane of the center of the active region, a flat reflective surface at 39.0° to the plane of the substrate adjacent to the patio, and reflective surface height 5 μm above the center of the active region.
Figure 7:
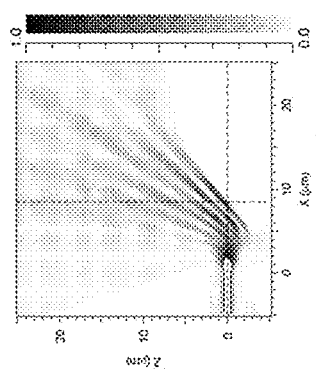
Figure 7:
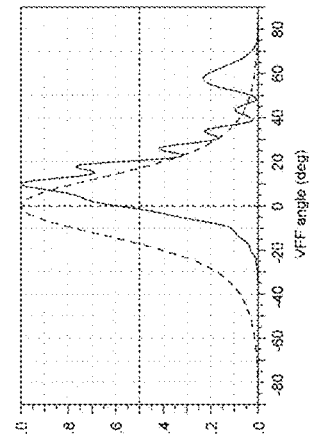

FIG. 1 (*a*) shows a semiconductor laser 100 formed through cleaving of front 130 and back 110 facets. The laser structure comprises a substrate 120 with epitaxially deposited layers that allow for the formation of a lower cladding layer 140, which may extend into the substrate or be completely epitaxially deposited as shown in FIG. 1 (*a*) and of thickness 1.83 μm, an active region 180 of 0.34 μm thickness, and an upper cladding layer 160 of 1.83 μm. The laser emits laser light at around 1310 nm. FIG. 1 (*b*) shows the vertical far-field (VFF) obtained through 2-dimensional RSoft Finite-Difference Time-Domain (FDTD) simulations from either the front or back facet of the structure in FIG. 1 (*a*).

The substrate 120 may be formed, for example, of a type III-V compound, or an alloy thereof, which may be suitably doped. The substrate 120, such as InP, includes a top surface on which is deposited, as by an epitaxial deposition such as Metalorganic Chemical Vapor Deposition (MOCVD) or Molecular Beam Epitaxy (MBE), a succession of layers which form an optical waveguide that includes the active region 180. The upper cladding 160 and lower cladding 140 regions, may be formed from lower index semiconductor material than the active region 180, such as InP, adjacent the active region 180, which may be formed with InAlGaAs-based quantum wells and barriers, sandwiched by AlGaInAs graded layers. The lower cladding may be formed partially through the epitaxial deposition and partly by using the substrate. For example, a 1310 nm emitting epitaxial structure can be formed with the following layers on an InP substrate 120: an n-InP lower cladding 140; an active region 180 containing: an AlGaInAs lower graded region, compressively strained AlGaInAs quantum wells, each sandwiched by tensile strained AlGaInAs barriers, an AlGaInAs upper graded region; a thick p-InP upper cladding 160; and a highly p-doped InGaAs contact layer. The structure may also have a wet etch stop layer to aid the fabrication of a ridge laser. The exemplary structure described above is designed to emit at a wavelength of 1310 nm.

FIG. 2 (*a*) shows a cross-section of a semiconductor laser 200 formed through etching of front 230 and back facets 210 at or close to perpendicular to the plane of the substrate 120, which is usually a deviation of the etched facet of up to 3.0° from the normal to the plane of the substrate. Examples of processes of forming etched facet lasers are described in U.S. patent application Ser. No. 11/356,203, U.S. Pat. No. 8,130,806, and U.S. Pat. No. 7,606,277, which are assigned to the assignee of the present application and the disclosures of which are hereby incorporated by reference herein in their entirety. The etched facets are typically formed by etching through the upper cladding layer, the active region, and at least part of the lower cladding. The laser chip is singulated at 270 so that a patio 250 adjacent the front facet 230 is 2 μm wide (2 μm is the horizontal distance between the front facet and the singulation plane 270). FIG. 2 (*b*) shows the VFF obtained through 2-dimensional RSoft FDTD simulations from the front facet in a solid line and the VFF from FIG. 1 (*b*) in dashed lines for reference. There is only a small difference between the two VFF curves.

FIG. 3 (*a*) shows a cross-section of a semiconductor laser 300 formed through etching of the front 230 and back 210 facets. The laser chip is singulated at 370 so that a patio 350 adjacent the front facet 230 is 10 μm wide. FIG. 3 (*b*) shows the VFF obtained through 2-dimensional RSoft FDTD simulations from the front facet in a solid line and the VFF from FIG. 1 (*b*) in dashed lines for reference. There is considerable difference between the two VFF curves. The VFF in the solid line shows a significant narrowing of its main lobe 380 full-width half-maximum (FWHM) compared to the dashed line. Furthermore, the VFF in the solid line shows a significant degree of beam pointing that is around 10.0° from the center and the presence of a side lobe 382. A narrow FWHM is very useful in, for example, allowing high coupling efficiency to an optical fiber. However, the beam pointing causes difficulty and incompatibility with most traditional approaches of packaging lasers and coupling to an optical fiber.

FIG. 4 (*a*) is a cross-section in the z-y plane of a semiconductor laser 400 formed through the etching of the front 230 and back 210 facets, with a flat patio of 15 μm adjacent the front facet and a flat reflective surface 420 adjacent to the patio at an angle of 45.0° to the plane of the substrate. The center of the active region at the facet is located at (z=0, y=0). The location of the 45.0° reflector is defined in the z-y plane with coordinates (z, y) given in micrometers. The same approach is taken for defining the reflective surface in all the figures below. The lower-left coordinate of the reflector is at (15,−2) and upper-right is at (19, 2) with a straight line connecting these two coordinates. The reflective surface is part of a reflector structure 440. The height of the reflector structure 440 is as high as the laser structure and 2 μm above the active region, similar to that disclosed in FIG. 8 of U.S. Pat. No. 7,799,587, assigned to the assignee of the present application and the disclosure of which is hereby incorporated by reference herein in its entirety, which was described as being coupled to a fiber through a lens. FIG. 4 (*b*) shows 2-dimensional RSoft FDTD simulations of the intensity of light for the light exiting the front facet and being modified by the reflective surface. FIG. 4 (*c*) shows the VFF in a direction perpendicular to the substrate in a solid line, while the VFF from FIG. 1 (*b*) is shown in dashed line for reference. There is significant distortion in the VFF as compared to the reference VFF, and as such an optical fiber positioned above the center of the reflective surface 420 at a 4.0° angle in an optimal distance only couples 21% of the laser light to a an optical fiber. The optical fiber used for this measurement, and all the optical fiber coupling measurements described below, is by a single mode fiber by Corning, Inc., known as SMF28 that has a core of 8.2 μm diameter and a cladding of 125 μm diameter. It will be understood that the VFF for the structure in FIG. 4 (*a*) is actually the far-field as measured parallel to the surface of the substrate generated by the vertical near-field of the laser. The same approach is taken with the remaining figures.

FIG. 5 (a) is a cross-section of a semiconductor laser 500 formed through the etching of the front 230 and back 210 facets, with a flat patio of 15 μm adjacent the front facet and a curved reflective surface 520 adjacent to the patio. The lower-left coordinate of the reflector is at (15,−2) and upper-right is at (19, 2) with a curved line connecting these two coordinates. The curved line is defined by $y=17.744-3.116z+0.1202z^2$. The reflective surface is part of a reflector structure 540. The height of the reflector structure 510 is as high as the laser structure and 2 μm above the center of the active region, similar to that disclosed in FIG. 9 of U.S. Pat. No. 7,799,587, which is also described as being coupled to a fiber through a lens. FIG. 5 (b) shows 2-dimensional RSoft FDTD simulations of the intensity of light for the light exiting the front facet and being modified by the reflective surface. FIG. 5 (c) shows the VFF in a direction perpendicular to the substrate in a solid line, while the VFF from FIG. 1 (b) is shown in dashed line for reference. There is significant distortion in the VFF as compared to the reference VFF, and an optical fiber directly positioned above the center of the reflective surface 520 at an optimal distance only couples 21% of the laser light.

Figure 6:
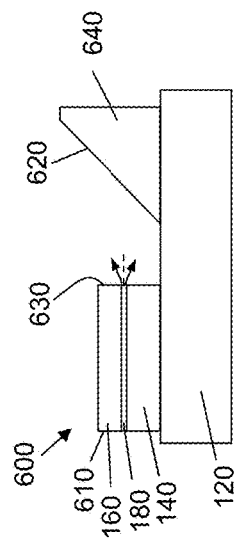
FIG. 6 (a) is a cross-section of a semiconductor laser with both front and back facets formed through etching, with a flat patio of length 5 μm adjacent the front facet, the patio surface at 3 μm below the plane of the center of the active region, a flat reflective surface at 45.0° to the plane of the substrate adjacent to the patio, and reflective surface height 5 μm above the center of the active region.
Figure 6:
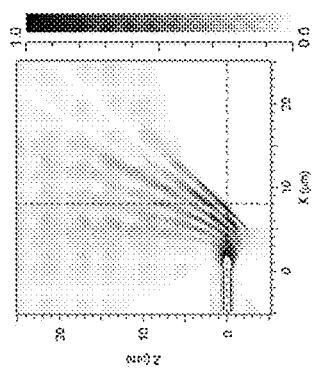
Figure 6:
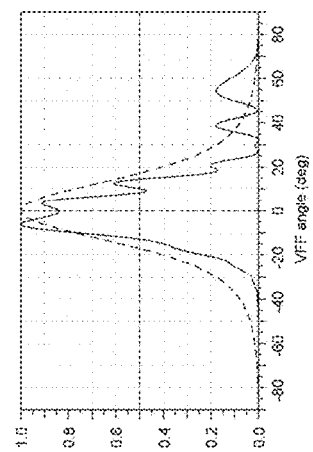

FIG. 6 (a) is a cross-section of a semiconductor laser 600 with both front 630 and back 610 facets formed through etching, with a flat patio of length 5 μm adjacent the front facet 630, the patio surface at 3 μm below the plane through the center of the active region, and a flat reflective surface 620 at 45.0° to the plane of the substrate adjacent to the patio and at a height 5 μm above the center of the active region. The lower-left coordinate of the reflector is at (5,−3) and upper-right is at (13, 5) with a straight line connecting these two coordinates. The reflective surface 620 is part of a reflector structure 640. FIG. 6 (b) shows 2-dimensional RSoft FDTD simulations of the intensity of light for the light exiting the front facet and being modified by the reflective surface 620. FIG. 6 (c) shows the VFF in a direction perpendicular to the substrate in a solid line, while the VFF from FIG. 1 (b) is shown in dashed line for reference. The VFF for the structure has slightly narrowed in comparison to the reference VFF, but still possesses some distortion. An optical fiber positioned above the center of the reflective surface 620 at an optimal distance couples 31% of the laser light.

Silicon photonics gratings receiving light at an angle other than perpendicular incidence can prevent back-reflection. This is discussed, for example, in Reflectionless grating couplers for Silicon-on-Insulator photonic integrated circuits by Vermeulen, et al., Optics Express, Volume 20 Issue 20, pages 22278-22283. Back-reflection can have detrimental impact on sources of light coupled to the silicon photonics such as distributed feedback (DFB) lasers and semiconductor optical amplifiers (SOAs). FIG. 7 (a) is a cross-section of a semiconductor laser 700 with both front 630 and back 610 facets formed through etching, with a flat patio of length 5 μm adjacent the front facet 630, the patio surface at 3 μm below the plane through the center of the active region, and a flat reflective surface 720 at 38.6° to the plane of the substrate adjacent to the patio and at a height 5 μm above the active region. The lower-left coordinate of the reflector is at (5,−3) and upper-right is at (15, 5) with a straight line connecting these two coordinates. The reflective surface 720 is part of a reflector structure 740. FIG. 7 (b) 2-dimensional shows RSoft FDTD simulations of the intensity of light for the light exiting the front facet and being modified by the reflective surface 720. FIG. 7 (c) shows the VFF in a direction perpendicular to the substrate in a solid line, while the VFF from FIG. 1 (b) is shown in dashed line for reference. The VFF for the structure has slightly narrowed in comparison to the reference VFF, but still possesses some distortion. The VFF peaks at 10.2° off from the perpendicular to the substrate. An optical fiber positioned above the reflective surface 720 at an angle of 10.2° at an optimal distance couples 29.5% of the laser light.

Figure 8:
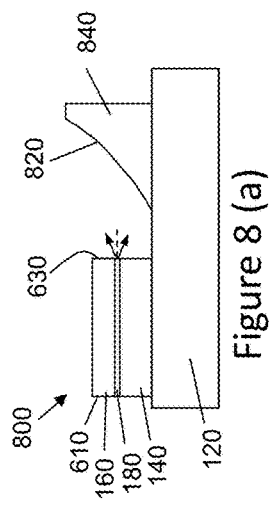
FIG. 8 (a) is a cross-section of a semiconductor laser with both front and back facets formed through etching, with a flat patio of length 5 μm adjacent the front facet, the patio surface at 3 μm below the plane of the center of the active region, a curved reflective surface having 45.0° angle between a plane intersecting the two ends of the curved surface and the plane of the substrate adjacent to the patio, a reflective surface height 5 μm above the center of the active region.
Figure 8:
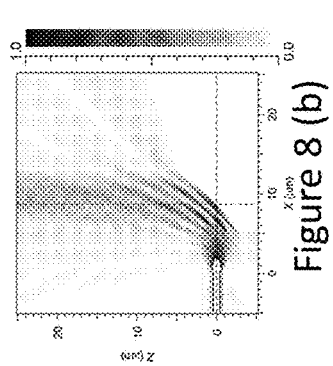
Figure 8:
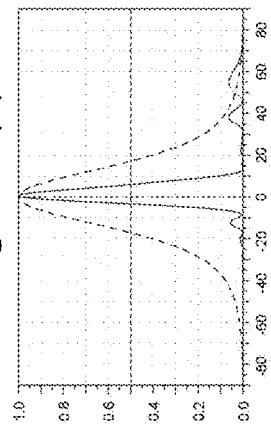

FIG. 8 (a) is a cross-section of a semiconductor laser 800 with both front 630 and back 610 facets formed through etching, with a flat patio of length 5 μm adjacent the front facet 630, the patio surface at 3 μm below the plane through the center of the active region, and a curved reflective surface 820 having 45.4° angle between a plane intersecting the two ends of the curved surface and the plane of the substrate adjacent to the patio and at a height 5 μm above the center of the active region. The lower-left coordinate of the reflector is at (5,−3) and upper-right is at (12, 9.5) with a curved line connecting these two coordinates. The curved line is defined by $y=-4.6337+0.084263z+0.051101\ z^2$. The reflective surface 820 is part of a reflector structure 840. FIG. 8 (b) shows 2-dimensional RSoft FDTD simulations of the intensity of light for the light exiting the front facet and being modified by the reflective surface 820. FIG. 8 (c) shows the VFF in a direction perpendicular to the substrate in a solid line, while the VFF from FIG. 1 (b) is shown in dashed line for reference. The VFF for the structure has narrowed significantly in comparison to the reference VFF and is devoid of distortion. An optical fiber positioned above the center of the reflective surface 820 at angle of 0.7° at an optimal distance couples 71.0% of the laser light, a very significant improvement over the coupling obtained from the structure of FIG. 6 (a).

Figure 9:
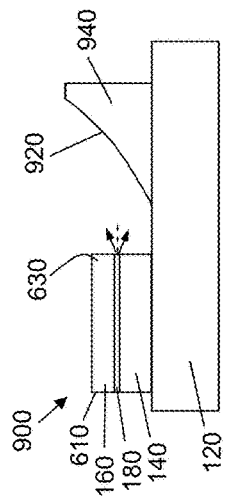
FIG. 9 (a) is a cross-section of a semiconductor laser with both front and back facets formed through etching, with a flat patio of length 5 μm adjacent the front facet, the patio surface at 3 μm below the plane of the center of the active region, a curved reflective surface having 40.0° angle between a plane intersecting the two ends of the curved surface and the plane of the substrate adjacent to the patio, a reflective surface height 5 μm above the center of the active region.
Figure 9:
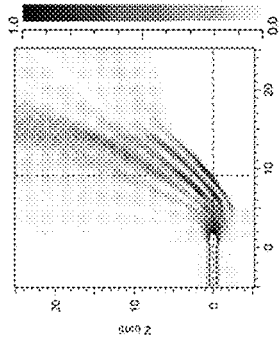
Figure 9:
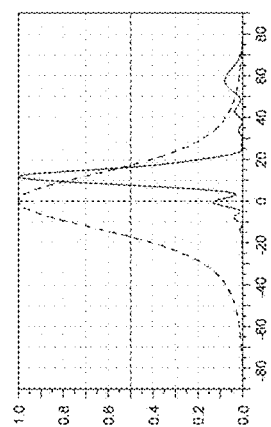

FIG. 9 (a) is a cross-section of a semiconductor laser 900 with both front 630 and back 610 facets formed through etching, with a flat patio of length 5 μm adjacent the front facet 630, the patio surface at 3 μm below the plane through the center of the active region, a curved reflective surface 920 having 39.5° angle between a plane intersecting the two ends of the curved surface and the plane of the substrate adjacent to the patio and at a height 5 μm above the center of the active region. The lower-left coordinate of the reflector is at (4.8,−3) and upper-right is at (14.5, 5) with a curved line connecting these two coordinates. The curved line is defined by $y=-4.5101+0.1643z+0.033644z^2$. The reflective surface 920 is part of a reflector structure 940. FIG. 9 (b) shows 2-dimensional RSoft FDTD simulations of the intensity of light for the light exiting the front facet and being modified by the reflective surface 920. FIG. 8 (c) shows the VFF in a direction perpendicular to the substrate in a solid line, while the VFF from FIG. 1 (b) is shown in dashed line for reference. The VFF for the structure has significantly narrowed in comparison to the reference VFF and peaks at 12.3° off from the perpendicular to the substrate. An optical fiber positioned above the reflective surface 920 at an angle of 12.3° at an optimal distance couples 71.0% of the laser light, a very significant improvement over the coupling obtained from the structure of FIG. 7 (a).

Silicon photonics applications are applications such as Active Optical Cables, chip-to-chip optical connectivity, and on-chip optical connectivity. In these applications, efficiency of coupling between a laser and the silicon photonics chip is extremely important since going from 30% efficiency to 60% leads to requiring half the laser light output power. So instead of a 40 mW output from the laser, a 20 mW output would be sufficient. The laser has its own efficiency converting electricity to light, so significantly less energy is consumed to generate the laser light output. In applications where the silicon photonics chips end up in places such as Data Centers, there is the additional benefit that energy is saved since less cooling needs to occur.

The work above has been with an external medium to the laser of refractive index of 1.0. However, addition work has been conducted with other external indices, for example, 1.5 that is close to the refractive index of certain epoxies that can be applied been the laser and the silicon photonics chip or an optical fiber. This additional work shows the ability to modify the design of the reflective surface to obtain very high coupling values with an external medium such as an epoxy.

Figure 10:
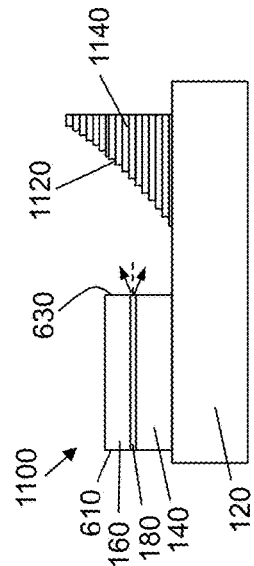
FIG. 10 (a) through (c) show an exemplary process for fabricating the structure in FIG. 8 (a).
Figure 10:
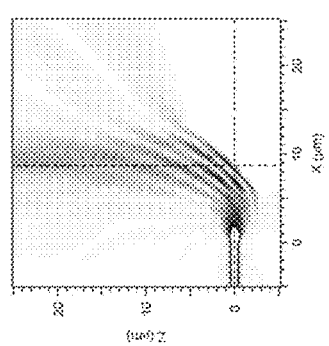
Figure 10:
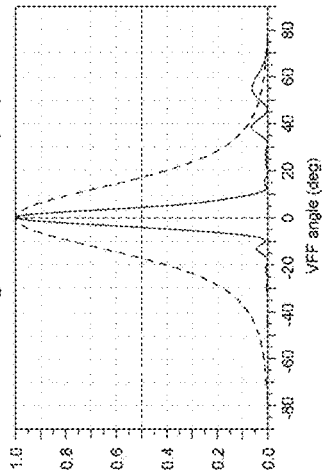

Gray-scale technology enables the development of arbitrary 3D microstructures in various materials, for example, Microfabrication of 3D silicon MEMS structures using gray-scale lithography and deep reactive ion etching, by Waits, et al., Sensors and Actuators A 119, pages 245-253, 2005, describes such an approach. FIG. 10 (a) shows an InP substrate with epitaxially deposited layers to form a lower cladding 140, and active region 180, an upper cladding layer 160, a highly p-doped InGaAs contact layer 1020, and an InP spacer layer 1010. On top of the spacer layer 1010, a layer of silicon dioxide 1030 is deposited through Plasma Enhanced Chemical Vapor Deposition (PECVD). Photoresist is then spun on and patterned. The patterns corresponding to the front facet 630, the back facet 610, and the curved reflective surface 820 of FIG. 8(a) are transferred in photoresist. The pattern corresponding to the two facets 630 and 610 are defined by conventional digital step-function mask, where either the photoresist is either exposed or not and is shown with photoresist pattern 1040. For the pattern corresponding to the curved reflective surface, a gray-scale mask is used so that a curved section 1050 is defined in photoresist. Reactive Ion Etching (RIE) is used to transfer the pattern of the photoresist 1040 and 1050 into the silicon dioxide layer 1030, forming silicon dioxide patterns 1060 and 1070, as shown in FIG. 10 (b). The photoresist is then removed and the silicon dioxide is used as a mask in Chemically Assisted Ion Beam Etching (CAIBE) to form the front 630 and back 610 facets of the laser and a pattern of a reflective surface 1080 in the same epitaxial material, as is shown in FIG. 10 (c). The remaining InP spacer layer 1010 on the laser is selectively removed with photolithographic definition and using 1:4 HCl—H$_3$PO$_4$ that stops on the InGaAs contact layer 1020. The pattern of the reflective surface 1080 is coated with a thin layer of titanium (Ti) followed by gold (Au) using metallization lift-off to form the reflective surface 820 in structure 840. The selectivity of photoresist to silicon dioxide during the RIE, the selectivity of the silicon dioxide to the epitaxial structure, and the desired shape for the reflective surface 1080 is used to arrive at the appropriate shaped photoresist pattern 1050.

In an alternative embodiment, the reflector structure 840 of FIG. 8(a) or 1140 of FIG. 11(a) may be formed using several sequential lift-off steps to form the shape of the reflector structure 840 from evaporated metal, or dielectric material (e.g., Si$_3$N$_4$, SiO$_2$) deposited by evaporation, sputtering, or low-temperature PECVD. Evaporated gold (Au) may then be deposited so that the reflective surface 820 or 1120 is indeed highly reflective.

Figure 11:
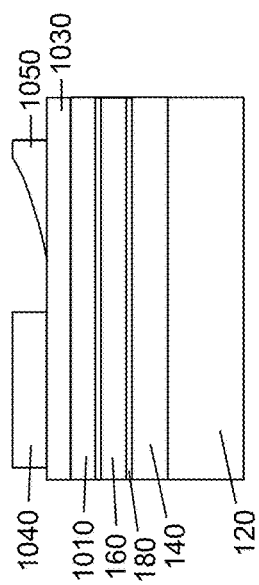
FIG. 11 (a) is a cross-section of a semiconductor laser with both front and back facets formed through etching, with a flat patio of length 5 μm adjacent the front facet, the patio surface at 3 μm below the plane of the center of the active region, a curved reflective surface approximated by 0.5 μm thick segments having 45.0° angle between a plane intersecting the two ends of the curved surface and the plane of the substrate adjacent to the patio, a reflective surface height 5 μm above the center of the active region.
Figure 11:
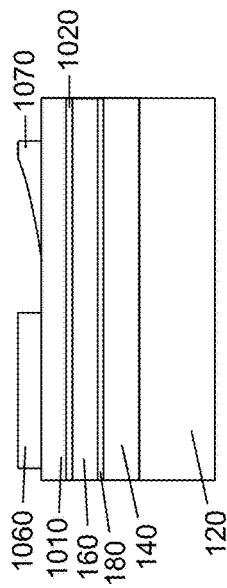
Figure 11:
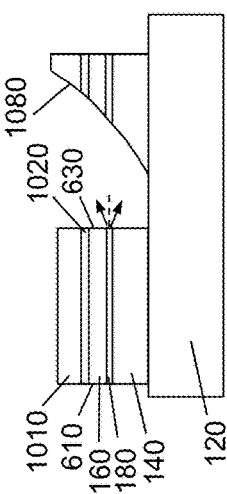

FIG. 11 (a) is a cross-section of a semiconductor laser 1100 with both front 630 and back 610 facets formed through etching, with a flat patio adjacent the front facet 630, a reflective surface 1120 that approximates the curved surface 820 from FIG. 8 (a) through vertical segments. The reflective surface 1120 is part of a reflector structure 1140 and is formed through 17 segments. Table 1 defines each of these segments from top to bottom with segment numbers 1 through 17, respectively. For each segment, the table provides the coordinates of the top-left corner of the segment and the segment thickness in microns.

TABLE 1

| Segment Number | z, y Coordinates | Segment Thickness |
|---|---|---|
| 1 | 12.87, 5 | 0.5 |
| 2 | 12.54, 4.5 | 0.5 |
| 3 | 12.2, 4 | 0.5 |
| 4 | 11.83, 3.5 | 0.5 |
| 5 | 11.45, 3 | 0.5 |
| 6 | 11.05, 2.5 | 0.5 |
| 7 | 10.63, 2 | 0.25 |
| 8 | 10.4, 1.75 | 0.5 |
| 9 | 9.96, 1.25 | 0.5 |
| 10 | 9.48, 0.75 | 0.5 |
| 11 | 8.98, 0.25 | 0.5 |
| 12 | 8.45, −0.25 | 0.5 |
| 13 | 7.9, −0.75 | 0.5 |
| 14 | 7.32, −1.25 | 0.5 |
| 15 | 6.7, −1.75 | 0.5 |
| 16 | 6.05, −2.25 | 0.5 |
| 17 | 5.38, −2.75 | 0.25 |

FIG. 11 (b) shows 2-dimensional RSoft FDTD simulations of the intensity of light for the light exiting the front facet and being modified by the reflective surface 1120. FIG. 11 (c) shows the VFF in a direction perpendicular to the substrate in a solid line, while the VFF from FIG. 1 (b) is shown in dashed line for reference. The VFF is almost identical to the one obtained in FIG. 8 (c). An optical fiber positioned above the center of the reflective surface 1120 at an angle of 0.2° at an optimal distance couples 70.0% of the laser light, so the approximation of the curved reflective surface with segments only leads to 0.8% loss compared to the what was seen with FIG. 8 (c).

The structure in FIG. 11 (a) may be fabricated in a variety of methods. An example of such a method uses the following epitaxial structure to aid in the fabrication processes. It employs thin etch stop layers of InGaAsP in an InP-based structure.

The following layers were epitaxially grown on an n-type InP substrate to form a 1310 nm emitting laser structure:
  n-doped InP buffer layer
  20 nm n-doped InGaAsP etch stop layer
  230 nm n-doped InP layer and 20 nm n-doped InGaAsP etch stop layer forms segment 17
  480 nm n-doped InP layer and 20 nm n-doped InGaAsP etch stop layer repeated 5 times form segments 16, 15, 14, 13 and 12
  90 nm n-doped InP layer, 105 nm undoped AlGaInAs graded layer, 10 nm undoped AlGaInAs tensile barrier, 6 nm undoped AlGaInAs compressive quantum well and 10 nm undoped AlGaInAs tensile barrier repeated 5 times, 105 nm undoped AlGaInAs graded layer, 90 nm p-doped InP layer, 20 nm p-doped InGaAsP etch stop layer form segment 11
  480 nm p-doped InP layer and 20 nm p-doped InGaAsP etch stop layer repeated 2 times form segments 10 and 9
  500 nm p-doped InP forms segment 8
  250 nm highly p-doped InGaAs contact layer forms segment 7

480 nm undoped InP layer and 20 nm undoped InGaAsP etch stop layer repeated 5 times forms segments 2, 3, 4, 5, and 6

500 nm undoped InP layer forms segment 1

The following process was used to form the semiconductor laser 1100. Lithography was performed to define segment 1 using 1:4 HCl—H$_3$PO$_4$ that etches 500 nm InP, but stops on the underlying InGaAsP layer.

The lithographic mask was removed and the next lithography performed to define segment 2. 1:1:10 H$_2$SO$_4$:H$_2$O$_2$:H$_2$O was used to etch the 20 nm InGaAsP layer followed by 1:4 HCl—H$_3$PO$_4$ that etches 480 nm InP, but stops on the underlying InGaAsP layer. This process was repeated 4 more times to form segments 3, 4, 5, and 6.

At this point segments 1 through 6 of were formed and also the surface of the laser epitaxial structure terminated by the highly p-doped InGaAs layer was exposed. Using processes such as those described U.S. patent application Ser. No. 11/356,203, U.S. Pat. No. 8,130,806, or U.S. Pat. No. 7,606,277, the etched facet laser with front facet 630 and back facet 610 were formed.

Segment 8, 9, and 10 were defined as segment 2 was defined.

Next lithography for segment 11 was performed, 1:1:10 H$_2$SO$_4$:H$_2$O$_2$:H$_2$O was used to etch the 20 nm InGaAsP layer, 1:4 HCl—H$_3$PO$_4$ used to etch 90 nm InP, 1:1:10 H$_2$SO$_4$:H$_2$O$_2$:H$_2$O to etch all layers containing AlGaInAs, and 1:4 HCl—H$_3$PO$_4$ used to etch 90 nm InP that stops on the underlying InGaAsP layer.

Segment 12, 13, 14, 15, 16, and 17 were defined as segment 2 was defined.

The vertical surface of the segments were coated with thin Ti followed by Au to form the reflective surface 1120.

The ability of changing the direction as well as the beam shape of a laser is very important for applications such as coupling to a silicon grating in a silicon photonics chip.

An etched facet laser has deterministic facet locations since the facets are defined through lithography. This is in contrast to cleaved facet lasers where the location of the facet is determined by the cleaving and is usually at least ±2 µm from the desired position. The addition of lithographically defined reflective surface that is lithographically aligned to the etched facet allows a high degree of control of the relative position between the etched facet laser and the reflective surface. This is important since it allows the reflective surface to play the dominant role in shaping and directing the beam.

In cases where the maximum amount of light needs to be reflected from the reflective surface, it is desirable to coat the reflective surface with a metal such as Au. This can be achieved, for example, by depositing a thin layer of Ti for adhesion followed by a layer of Au on the reflective surface. In the simulations presented herein, whenever a reflective surface was used, it was Au coated.

FIG. 12 (a) shows a perspective view of an etched facet 2 µm wide ridge laser with a curved reflective surface positioned adjacent to the front facet, used to modify the direction and shape of the beam. FIG. 12 (a) is a 3-dimensional version of the structure in FIG. 8 (a), so the curved reflective surface follows the same pattern in the z-y cross-section. FIG. 12 (b) shows the far-field in a cross-section parallel to the plane of the substrate and obtained through 3-dimensional RSoft FDTD simulations. It will be understood that the horizontal far-field (HFF) for the structure of FIG. 12 (a) is actually the far-field as measured parallel to the surface of the substrate generated by the horizontal near-field of the laser. The same approach is taken with the remaining figures. The far-field pattern shows a HFF of 15.8° with the HFF centered at 0.0° and a VFF of 9.0° with the VFF center at −0.3°.

Figure 13:
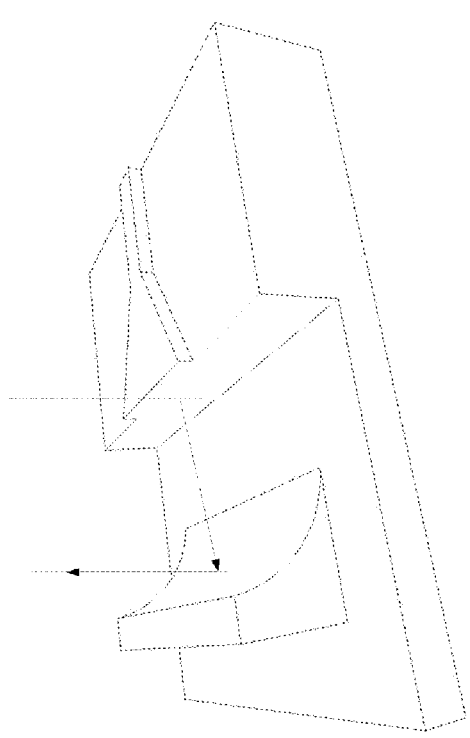
FIG. 13 (a) shows a perspective view of an etched facet tapered ridge laser with a curved reflective surface positioned adjacent to the front facet, used to modify the direction and shape of the beam, while the beam center is close to a perpendicular plane through the cavity along the ridge.
Figure 13:
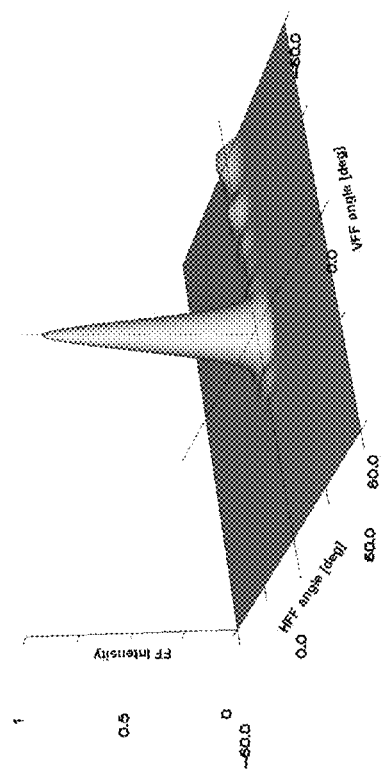

FIG. 13 (a) shows a perspective view of an etched facet tapered ridge laser with a curved reflective surface positioned adjacent to the front facet, used to modify the direction and shape of the beam. The curved reflective surface is the same as that in FIG. 12 (a). The length of the cavity was 250 µm, with the ridge at 2 µm prior to the taper. In the tapered region, the ridge linearly expands from 2 µm to 8 µm over a 75 µm length. FIG. 13 (b) shows the far-field in a cross-section parallel to the plane of the substrate and obtained through 3-dimensional RSoft FDTD simulations. The far-field pattern shows a HFF of 9.7° with the HFF centered at 0.0° and a VFF of 9.4° with the VFF center at −0.3°. The addition of the taper allows the narrowing of the HFF that can allow even better coupling to a silicon photonics chip or an optical fiber.

Figure 14:
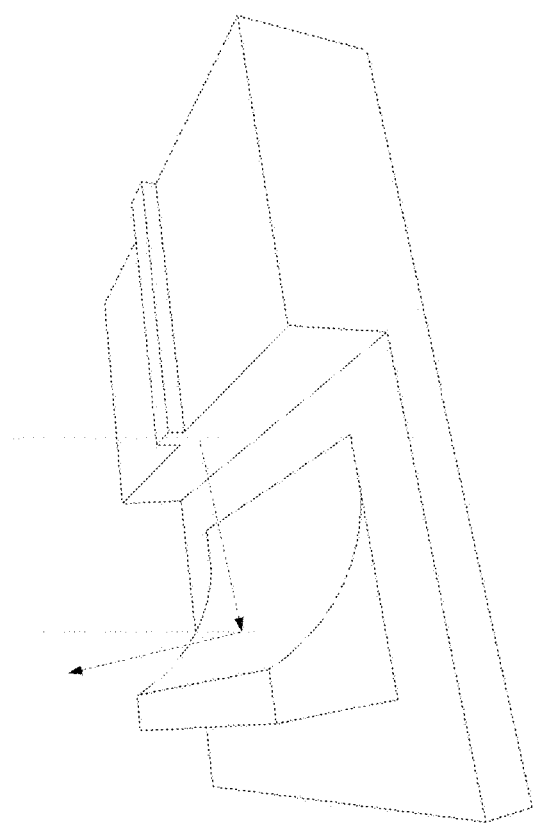
FIG. 14 (a) shows a perspective view of an etched facet ridge laser with a curved reflective surface positioned adjacent to the front facet, used to modify the direction and shape of the beam, while the beam center is outside of a perpendicular plane through the cavity along the ridge.
Figure 14:
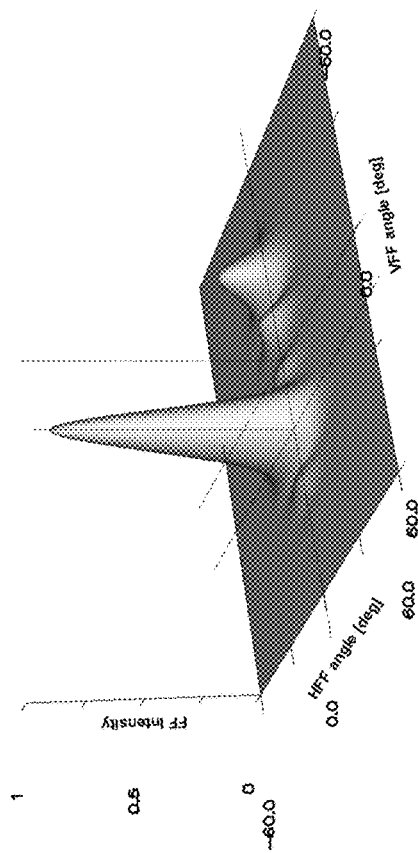

FIG. 14 (a) shows a perspective view of an etched facet 2 µm wide ridge laser with a curved reflective surface positioned adjacent to the front facet, used to modify the direction and shape of the beam, while the beam center is outside of a perpendicular plane through the cavity along the ridge. FIG. 14 (b) shows the far-field in a cross-section parallel to the plane of the substrate and obtained through 3-dimensional RSoft FDTD simulations. The far-field pattern shows a HFF of 15.5° with the HFF centered at 0.0° and a VFF of 9.6° with the VFF center at 12.3°.

Figure 15:
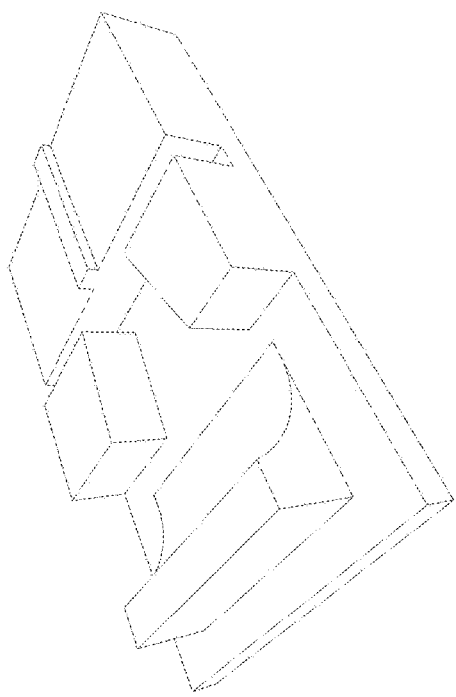
FIG. 15 (a) shows an etched facet 2 μm wide ridge laser with a first section adjacent the front facet that modifies the horizontal far-field (HFF) and a second section with a curved reflector adjacent the first section that modifies the direction of the beam and the VFF.
Figure 15:
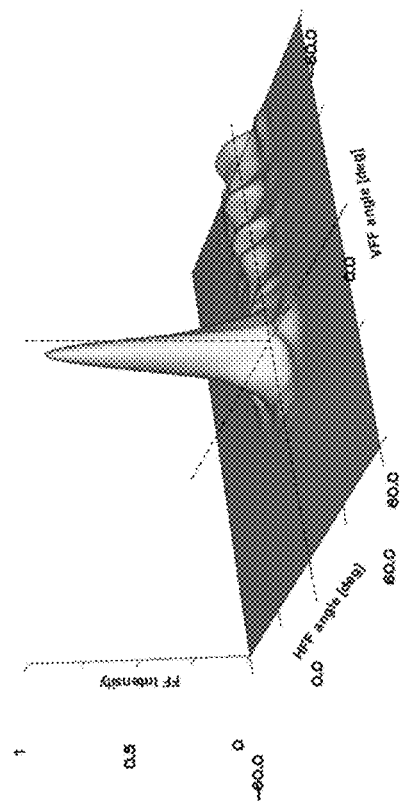

FIG. 15 (a) shows an etched facet 2 µm wide ridge laser with a first section adjacent the front facet that modifies the HFF, as described in U.S. patent application Ser. No. 13/889,207, which is assigned to the assignee of the present application and the disclosure of which is hereby incorporated by reference herein in its entirety. The gap at the closest section of the two walls is 6 µm. The angle of the walls is 10.0° and the length of the walls is 10 µm. FIG. 15 (a) also shows a second section with a curved reflector adjacent the first section that modifies the direction of the beam and the VFF. In the z-y cross-section, the lower-left coordinate of the reflector is at (12, −5) and upper-right is at (23.5, 7) with a curved line connecting these two coordinates. The curved line is defined by y=−4.8079−0.52299z+0.043255z$^2$. FIG. 15 (b) shows the far-field in a cross-section parallel to the plane of the substrate and obtained through 3-dimensional RSoft FDTD simulations. The far-field pattern shows a HFF of 13.5° with the HFF centered at 0.0° and a VFF of 8.1° with the VFF center at 1.7°. The structure in FIG. 15 (a) is an alternative to the structure FIG. 13 (a) for modifying both the VFF and HFF.

Figure 16:
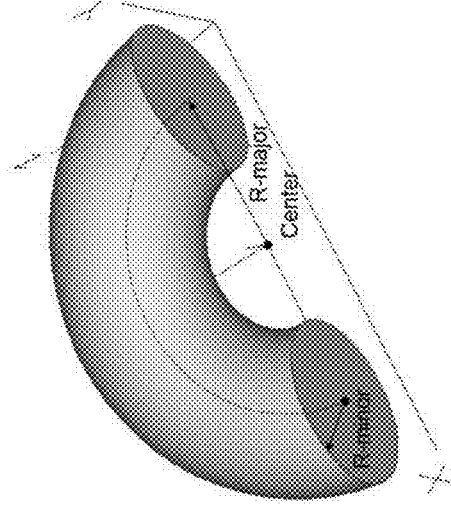
FIG. 16 (*a*) shows a perspective view of a torus.
Figure 16:
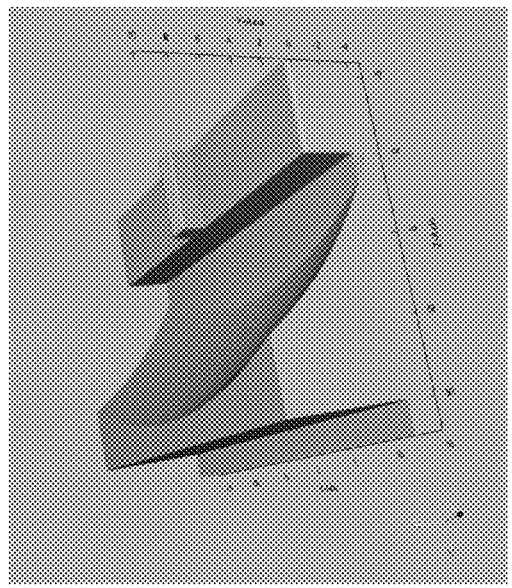
Figure 16:
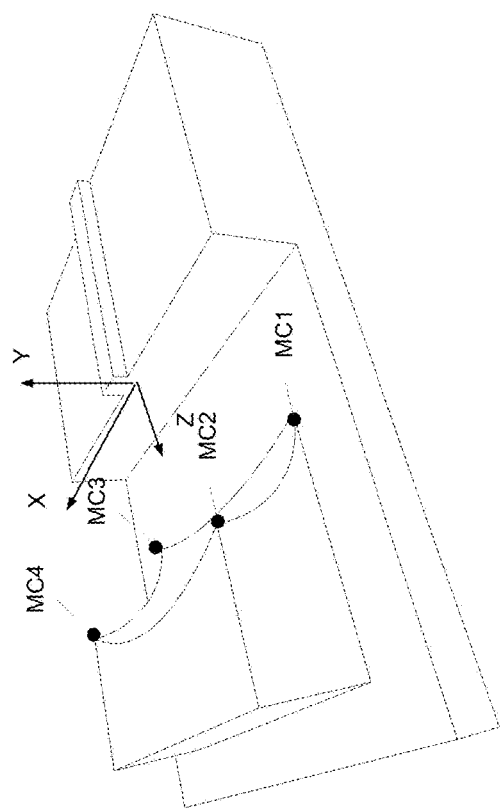
Figure 16:
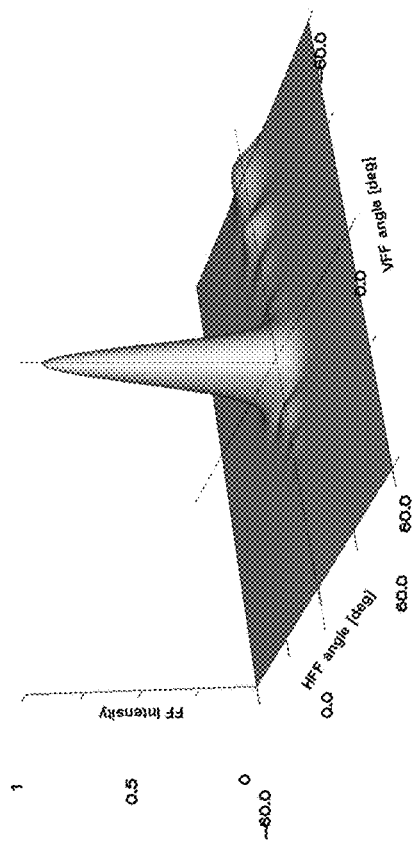

FIG. 16 (a) shows a perspective view of a torus in the x, y, z space and defines the major radius or R-major, the minor radius R-minor, and the center of the torus. FIG. 16 (b) shows in greyscale a perspective view of an etched facet 2 µm wide ridge laser with a curved reflective surface defined by the intersection of the surface of a torus and a rectangle, positioned adjacent to the front facet, used to modify the direction and shape of the beam in both the VFF and HFF. FIG. 16 (c) shows the FIG. 16 (b) with a line drawing representation in the x, y, z space and defines the corners of the curved reflective surface with MC1, MC2, MC3, and MC4. In this example, the torus is defined by R-major of 20 µm, R-minor of 50 µm, and the location of the center of the torus is (10, 18, −11) in the (x, y, z) coordinate system with units of µm. MC1 is located at (−10, −3, 3.7), MC2 at (−10, 5, 11.7), MC3 at (10, −3, 3.7), and MC4 at (10, 5, 11.7). The center of the active region on the facet at the center of the ridge is (0, 0, 0). FIG. 16 (d) shows the far-field in a cross-section parallel to the plane of the substrate and obtained through 3-dimensional RSoft FDTD simulations. The far-field pattern shows a HFF of 13.5° with the HFF centered at 0.0° and a VFF of 9.7° with the VFF center at 1.7°. Compared to FIG. 12 (*b*), we see narrowing of the HFF. The structure may be built using, for example, one of the approaches described above.

Figure 17:
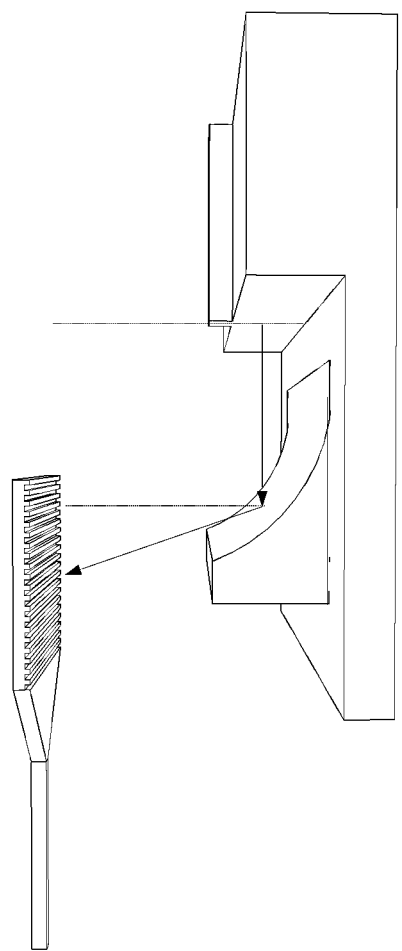
FIG. 17 shows a etched facet ridge laser with a curved reflective structure integrated with a silicon grating portion of a silicon photonics chip.

FIG. 17 shows an etched facet ridge laser with a curved reflective structure integrated with a silicon grating section of a silicon photonics chip together with an adiabatic taper. With the modification of the beam shape and beam direction, the laser can be flip-chip mounted on to the silicon photonics chip. Although the silicon grating is shown outside the adiabatic taper, grating in the taper such as those taught by Compact Focusing Grating Couplers for Silicon-on-Insulator Integrated Circuits by Van Laere, et al., IEEE Photonics Technology Letters, Volume 19, Issue 23, pages 1919-1921 (2007) can be used. Although the beam direction has been depicted as having an angle away from the laser, it will be understood that the curvature of the reflective surface can be designed to have the beam have an angle towards the laser.

Figure 18:
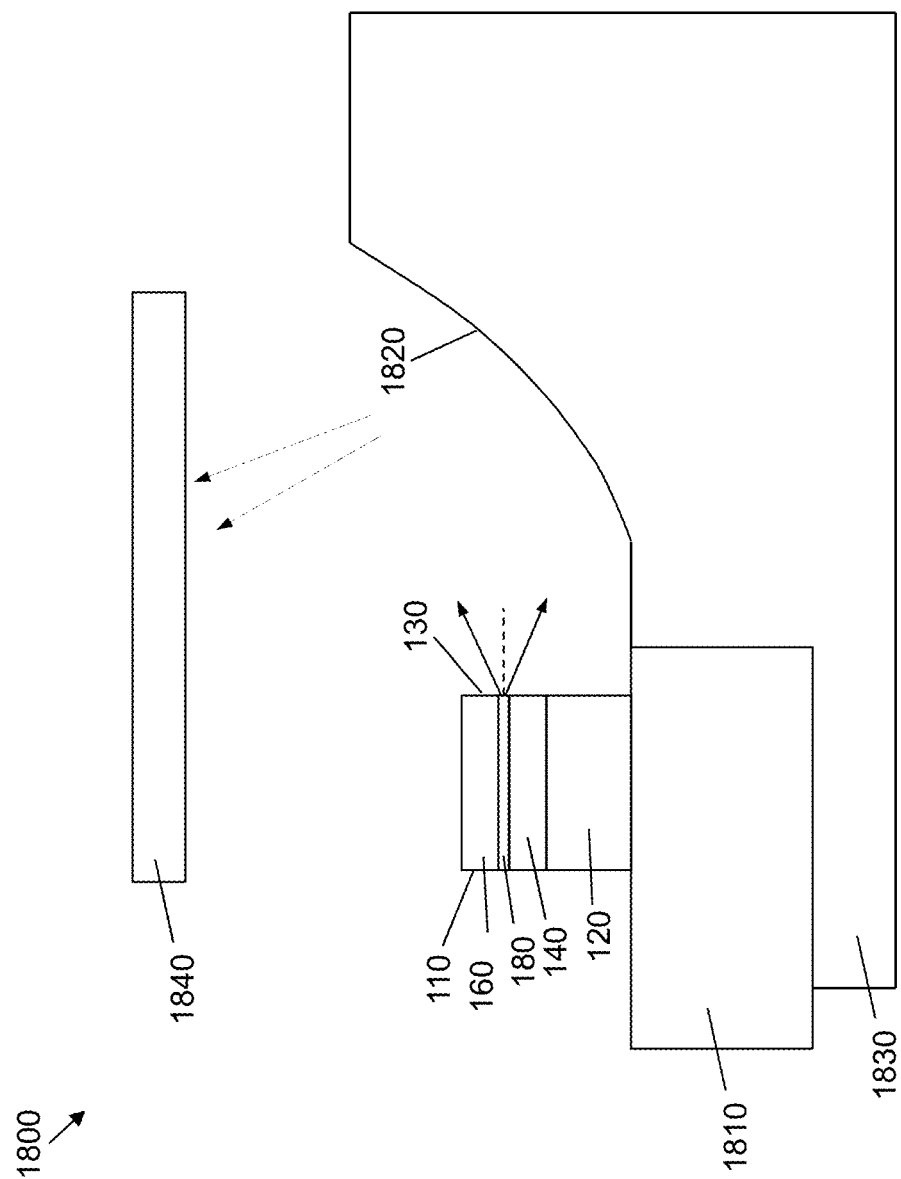
FIG. 18 shows a cleaved facet laser mounted active region up on a submount, the submount positioned on a patterned carrier substrate with a curved reflector facing the front facet of the laser.

FIG. 18 depicts a hybrid assembly 1800 of a cleaved facet laser, a submount 1810, a patterned substrate 1830 with a curved reflector 1820, and silicon gratings 1840 of a silicon photonics chip. A laser with front 130 and back 110 cleaved facets is mounted active region up on the submount 1810. The submount 1810 is mounted on the patterned carrier substrate 1830 with the curved reflector 1820 facing the front facet 130 of the laser. The carrier substrate 1830 can be fabricated, for example, from molded plastic with a reflective coating applied to form the reflector 1820. The carrier substrate can have a shape that allows the submount to be positioned with a high level accuracy with respect to the carrier substrate. The beam direction and beam shape can be modified to couple, for example, the silicon gratings 1840 on a silicon photonics chip with high efficiency.

Figure 19:
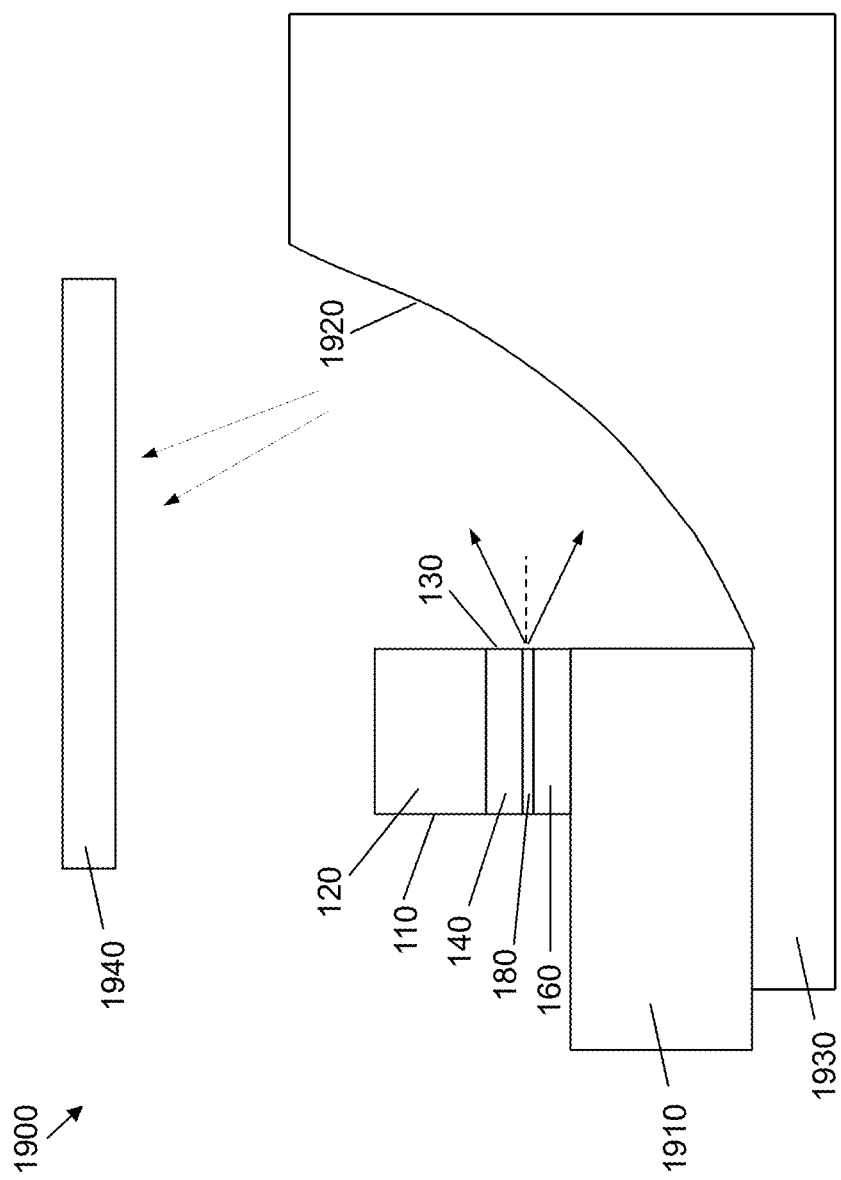
FIG. 19 shows a cleaved facet laser mounted active region down on a submount, the submount positioned on a patterned carrier substrate with a curved reflector facing the front facet of the laser.

FIG. 19 depicts a hybrid assembly 1900 of a cleaved facet laser, a submount 1910, a patterned substrate 1930 with a curved reflector 1920, and silicon gratings 1940 of a silicon photonics chip. A laser with front 130 and back 110 cleaved facets is mounted active region down on the submount 1910. The submount 1910 is mounted on the patterned carrier substrate 1930 with the curved reflector 1920 facing the front facet 130 of the laser. The carrier substrate 1930 can be fabricated, for example, from molded plastic with a reflective coating applied to form the reflector 1920. The beam direction and beam shape can be modified to couple, for example, the silicon gratings 1940 on a silicon photonics chip with high efficiency. FIG. 19 shows the beam direction to have a component in the direction of the laser.

As discussed earlier, given the lithographic definition of etched facets, they are formed with their position well-defined or in a deterministic manner. The same applies for lithographically defined reflective surface. As such, the laser chip lends itself to not needing active alignment, and compatible with passive alignment. For example, if the laser chip including the reflective surface has fuducials or alignment marks that can be matched to fuducials on the silicon photonics chip, passive alignment as opposed to expensive active alignment can be performed. Furthermore, with the placement of solder balls or columns on the laser chip and matching pads on the silicon photonics chip (or solder balls or columns on the silicon photonics chip and matching pads on the laser chip), self-alignment of the chip can be performed through the solder reflow process.

Etched facet lasers can be designed to operate in non-hermetic environments, as described in U.S. patent application Ser. No. 11/356,203, which is assigned to the assignee of the present application and the disclosure of which is hereby incorporated by reference herein in its entirety. This is particularly interesting for applications such as silicon photonics. Flip-chip placement of a laser chip that is capable of operating in non-hermetic environments onto a silicon photonics chip eliminates the need to place a hermetic package around the combination. This is a major cost advantage.

Single longitudinal mode lasers are more desirable than multi-longitudinal mode lasers in many applications. One such application is in data communications where longer reaches of communications are obtained with a single longitudinal mode lasers compared to a multi-longitudinal laser. As discussed above, a DFB laser with one or more of the following: staircase, roof, and reflective sidewalls, allow the beam shape from the laser to be modified. U.S. Pat. No. 7,835,415, assigned to the assignee of the present application and the disclosure of which is hereby incorporated by reference herein in its entirety, teaches an alternative single longitudinal laser that can be used in conjunction with the present disclosure for laser beam control.

Semiconductor lasers with high VFF values, such as greater than 40.0°, can be designed to have lower threshold currents, which is desirable. However, typically, these lasers have poor coupling to, for example, optical fibers. The present disclosure allows for low threshold current benefits of a high VFF, while allowing good coupling efficiency.

Although the present disclosure was described in terms of a 1310 nm emitting InP based laser, it will be understood that other wavelengths on laser structures on InP, as well as other wavelength lasers on other substrates, such as violet, blue, and green on laser structures on GaN substrates and infrared and red on lasers structures on GaAs substrates can also benefit from the present disclosure.

Although the disclosure has been described primarily for a laser, it is applicable to SOAs and reflective SOAs that are coupled to the silicon photonics chips that generate a cw laser source by coupling the SOA to a grating in the silicon photonics chip that provides feedback to the SOA to form a laser.

The beam shape and beam direction modification of a laser, as discussed above, can eliminate the need for heavy and expensive lenses for applications such as retinal projectors and pico-projectors. For example, visible laser sources based on GaN or GaAs substrates with the beam shape and beam direction modification, as described above, allows efficient coupling with Micro-Electro-Mechanical Systems (MEMS) based structures to build a compact and light weight retinal projector or pico-projector.

Although the present disclosure has been illustrated in terms of preferred embodiments, it will be understood that variations and modifications may be made without departing from the true spirit and scope thereof as set out in the following claims.

The invention claimed is:

1. A semiconductor laser, comprising:
   a substrate;
   a laser structure on the substrate, the laser structure comprising an active region that emits light;
   an etched facet formed in the laser structure;
   a reflective surface disposed apart from the etched facet to receive and reflect light emitted from the active region through a single medium, the reflective surface having a curvature; and
   a flat patio surface formed on the substrate and disposed between and adjacent to both the etched facet and the reflective surface, the flat patio surface separating the etched facet and the reflective surface directly beneath the active region by a first distance, the flat patio surface forming a plane that runs parallel to a center plane of the active region, the plane of the flat patio surface and the center plane of the active region separated by a second distance, the center plane of the active region and a plane parallel to the center plane of the active region and touching a top of the reflective surface separated by a third distance, wherein the first distance is greater than the second distance and approximately equal to the third distance.

2. The semiconductor laser of claim 1, wherein the laser structure is an epitaxial laser structure formed on the substrate.

3. The semiconductor laser of claim 2, wherein the laser structure further comprises:
a lower cladding layer disposed between the substrate and the active region; and
an upper cladding layer disposed adjacent the active region opposite the substrate.

4. The semiconductor laser of claim 3, wherein the laser structure further comprises:
a contact layer disposed adjacent the upper cladding layer opposite the active region.

5. The semiconductor laser of claim 4, wherein the reflective surface is disposed apart from the etched facet such that the top of the reflective surface extends above a top of the contact layer.

6. The semiconductor laser of claim 1, wherein the reflective surface is disposed apart from the etched facet such that the top of the reflective surface extends above a top of the active layer.

7. The semiconductor laser of claim 1, wherein the reflective surface is part of a reflective structure on the substrate.

8. The semiconductor laser of claim 7, wherein the reflective structure is an epitaxial structure formed on the substrate.

9. The semiconductor laser of claim 8, wherein the reflective structure is an epitaxial layered structure formed on the substrate.

10. The semiconductor laser of claim 1, wherein the reflective surface is coated with a reflective material.

11. The semiconductor laser of claim 10, wherein the reflective material is gold.

12. The semiconductor laser of claim 11, wherein the reflective surface is coated with titanium and gold.

13. The semiconductor laser of claim 1, wherein the laser structure is a ridge laser.

14. The semiconductor laser of claim 13, wherein the ridge laser comprises a ridge that expands as it approaches the etched facet.

15. The semiconductor laser of claim 1, wherein the curvature of the reflective surface is concave.

16. The semiconductor laser of claim 15, wherein the reflective surface is disposed at an approximate 45° angle between a plane intersecting two ends of the reflective surface and a plane of the etched facet.

17. The semiconductor laser of claim 16, wherein the reflective surface reflects the light in a direction substantially parallel to the plane of the etched facet.

18. The semiconductor laser of claim 15, wherein the reflective surface is disposed at an approximate 45° angle between a plane intersecting two ends of the reflective surface and a plane normal to the plane of the flat patio surface.

19. The semiconductor laser of claim 18, wherein the reflective surface reflects the light in a direction substantially parallel to the plane normal to the plane of the flat patio surface.

20. The semiconductor laser of claim 1, further comprising at least one sidewall disposed between the etched facet and the reflective surface to modify a direction of the light emitted from the active region.

21. The semiconductor laser of claim 1, wherein the reflective surface is configured to reflect the light at an angle other than 90° from a direction at which the light is received at the reflective surface.

22. The semiconductor laser of claim 21, wherein the angle is away from the laser structure.

23. The semiconductor laser of claim 21, wherein the angle is towards the laser structure.

24. The semiconductor laser of claim 7, wherein the reflective structure does not include an active region.

25. The semiconductor laser of claim 1, wherein the curvature of the reflective surface is toroidal.

* * * * *